(12) United States Patent
Sergoyan et al.

(10) Patent No.: US 6,995,574 B2
(45) Date of Patent: Feb. 7, 2006

(54) MEASUREMENT OF A COATING ON A COMPOSITE USING CAPACITANCE

(75) Inventors: Edward G. Sergoyan, Mill Creek, WA (US); Kirk Jackson, Boise, ID (US); Robert G. Olsen, Pullman, WA (US)

(73) Assignee: The Boeing Company, Chicago, IL (US)

(*) Notice: Subject to any disclaimer, the term of this patent is extended or adjusted under 35 U.S.C. 154(b) by 13 days.

(21) Appl. No.: 10/740,013

(22) Filed: Dec. 18, 2003

(65) Prior Publication Data
US 2005/0134293 A1    Jun. 23, 2005

(51) Int. Cl.
*G01R 27/26* (2006.01)
(52) U.S. Cl. ...................... 324/662; 324/663
(58) Field of Classification Search ............... 324/635, 324/662, 671, 663, 71.1
See application file for complete search history.

(56) References Cited

U.S. PATENT DOCUMENTS

| | | | |
|---|---|---|---|
| 3,801,900 A * | 4/1974 | Szasz ........................... 324/671 |
| 4,947,131 A | 8/1990 | Mayer et al. ................ 324/671 |
| 5,093,626 A * | 3/1992 | Baer et al. ................... 324/671 |
| 5,138,268 A | 8/1992 | Mulkey et al. .............. 324/671 |
| 5,225,785 A | 7/1993 | Mayer et al. ................ 324/671 |
| 5,293,132 A * | 3/1994 | Koch ........................... 324/671 |
| 5,382,911 A * | 1/1995 | Cotler et al. ................. 324/662 |
| 5,746,905 A * | 5/1998 | Murray ........................ 205/791 |
| 6,184,694 B1 | 2/2001 | Anderson et al. ........... 324/635 |
| 6,297,648 B1 | 10/2001 | Lunden ....................... 324/635 |
| 6,529,014 B1 * | 3/2003 | Nix ............................. 324/662 |

FOREIGN PATENT DOCUMENTS

| EP | 442 727 B1 | 10/1996 |
| EP | 558 736 B1 | 12/1997 |

* cited by examiner

*Primary Examiner*—Walter Benson
(74) *Attorney, Agent, or Firm*—Harness Dickey & Pierce P.L.C.

(57) ABSTRACT

A method for measuring a thickness of a non-conductive coating on a semi-conductive substrate includes placing a pair of conducting plates in contact with the non-conductive coating. A capacitance value of the non-conductive coating in combination with the semi-conductive component is measured using a capacitance meter. The measured capacitance value of the non-conductive coating in combination with the semi-conductive component is then used to determine an independent capacitance value of the non-conductive coating. The thickness of the non-conductive coating is directly related to the independent capacitance value of the non-conductive coating.

29 Claims, 2 Drawing Sheets

MEASUREMENT OF A COATING ON A COMPOSITE USING CAPACITANCE

FIELD OF INVENTION

The invention relates generally to measuring the thickness of a film coating on a substrate. More specifically, the invention relates to measuring the thickness of a non-metallic film coating on a semi-conductive substrate.

BACKGROUND OF THE INVENTION

Coated surfaces are ubiquitous in today's society. Objects from integrated circuit boards, to optical lenses, to counter tops, to aircraft have coated surfaces. The surfaces may be coated with a protectant, such as an epoxy primer or a chemical barrier, or may be coated with an aesthetic layer such as paint or a decorative polymer. Often times the thickness of such coatings must be held to very strict specifications. For example, there may be a weight limit for components on a mobile platform, such as an aircraft, train, bus or ship that are required to be coated with a primer. Often such components arrive from suppliers uncoated and near maximum weight. Therefore, care must be taken to make sure that an adequate amount of primer is applied without exceeding the weight requirements. Additionally, the primer may be a corrosion inhibitor or a coating for restricting fluid leaks, such as a gas or a liquid, and therefore, must be applied at a uniform thickness. An outer paint coating may also be applied. Although the paint may only be a decorative coating, accurate control of the thickness is no less important. The weight must be kept to a minimum and must be applied uniformly for peak performance of the mobile platform.

Typically the thickness of non-metallic coatings on objects made of metallic materials can be measured by several conventional commercial tools. However, more and more objects, or components of objects, are manufactured from composite materials such as carbon fiber epoxy, carbon Kevlar® or fiberglass. The thickness of non-metallic coatings on these materials is difficult to measure since the substrate, i.e. the uncoated object or component, is only semi-conductive at best.

In at least one known method of measuring a non-metallic coating on a semi-conductive composite substrate, the substrate is weighed, then coated, then weighed again and checked for balance. If the coating is suspected of being too thick or uneven, the coating may need to be removed and recoated. In many cases, such as with a mobile platform, a coated component may have to be disassembled and recoated. This can cause significant increase in the labor costs of measuring the thickness of the coating and significant increase in the risk of damage to the substrate/component. Another known method of measuring a non-metallic coating on a semi-conductive composite substrate is to use an ultrasonic measurement system. However, typically ultrasonic measurement systems are not sufficiently reliable to accurately measure the thickness of thin film coatings such as paint. In addition, the nature of ultrasonic measurement requires the technician to interpret complex waveforms that require extensive training and certification.

Therefore, it would be desirable to accurately measure the thickness of thin film non-metallic coatings on a semi-conductive substrate, such as an aircraft control surface component, without having to weight the substrate. This can significantly reduce the labor costs and the risk of damage.

BRIEF SUMMARY OF THE INVENTION

In a preferred embodiment of the present invention a method is provided for measuring a thickness of a non-conductive coating on a semi-conductive component of a mobile platform. The method includes placing a first conducting plate in contact with the non-conductive coating on the semi-conductive component of a mobile platform at a first location. Placing the first conducting plate at the first location creates a first portion of a capacitor having the non-conductive coating as a dielectric. The method additionally includes placing a second conducting plate in contact with the non-conductive coating on the surface of the semi-conductive component of the mobile platform at a second location. Placing the second conducting plate at the second location creates a second portion of the capacitor having the non-conductive coating as a dielectric, thereby completing a capacitive circuit. The method further includes measuring a capacitance value of the non-conductive coating in combination with the semi-conductive mobile platform component. The non-conductive coating has a first dielectric constant and the semi-conductive mobile platform component has a second dielectric constant. A capacitance meter electrically connected to the first and second conducting plates is used to measure the capacitance value of the non-conductive coating in combination with the semi-conductive mobile platform component. Further yet, the method includes using the measured capacitance value of the non-conductive coating in combination with the semi-conductive component to determine the thickness of the non-conductive coating. More specifically, a change in capacitance from a known capacitance of the semi-conductive component without the non-conductive coating and the measured capacitance with the non-conductive coating is directly proportional to the thickness of the non-conductive coating.

The features, functions, and advantages can be achieved independently in various embodiments of the present inventions or may be combined in yet other embodiments.

BRIEF DESCRIPTION OF THE DRAWINGS

The present invention will become more fully understood from the detailed description and accompanying drawings, wherein.

Corresponding reference numerals indicate corresponding parts throughout the several views of drawings.

DETAILED DESCRIPTION OF THE INVENTION

The following description of the preferred embodiments is merely exemplary in nature and is in no way intended to limit the invention, its application or uses. Additionally, the advantages provided by the preferred embodiments, as described below, are exemplary in nature and not all preferred embodiments provide the same advantages or the same degree of advantages.

Figure 1:
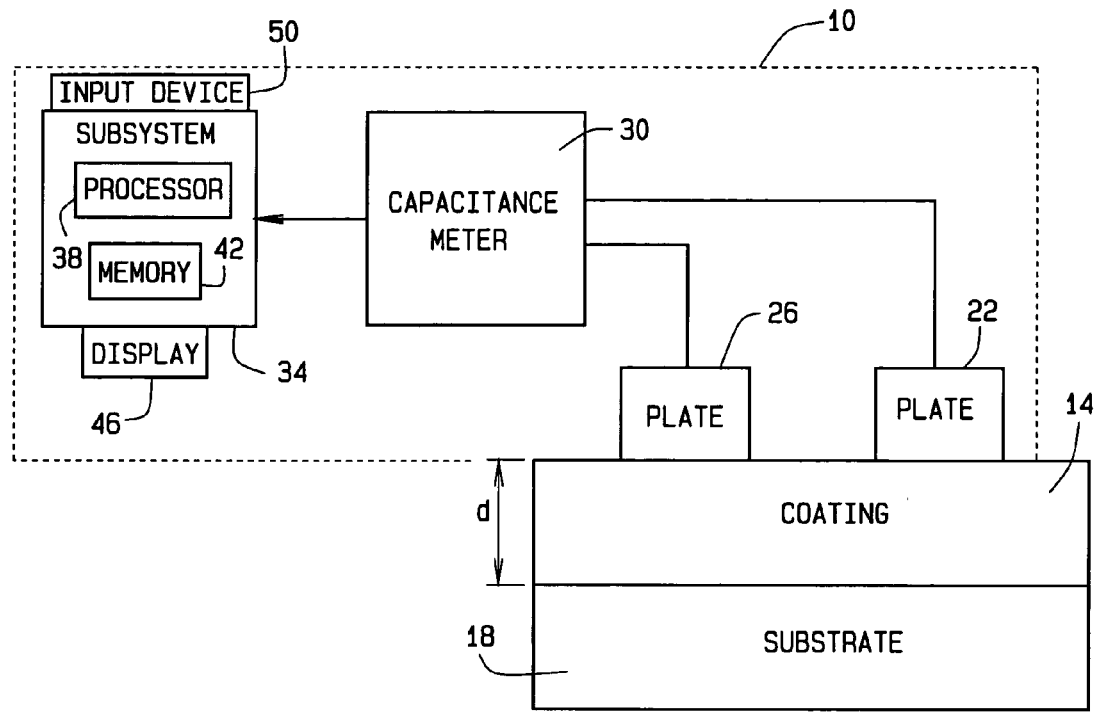
FIG. 1 is a block diagram of a system for measuring the thickness of a non-conductive coating on a semi-conductive substrate, in accordance with a preferred embodiment of the present invention.

FIG. 1 is a block diagram of a system 10 for measuring a thickness d of a coating 14 on a substrate 18, in accordance with a preferred embodiment of the present invention. In a preferred embodiment the coating 14 is comprised of a non-conductive material and the substrate 18 is constructed of a semi-conductive material or compound. Additionally, in a preferred embodiment, the coating 14 is a non-conductive coating, such as paint, and the substrate 18 is a component of a mobile platform constructed of a semi-conductive composite. For example, the semi-conductive composite substrate 18 can be a control surface component of an aircraft coated with a corrosion inhibiting paint primer. System 10 includes a first conductive plate 22 and a second conductive plate 26 electrically connected to a capacitance meter 30. The first and second conductive plates 22 and 26 are adapted to be placed spaced apart in direct contact with the coating 14 when measuring the thickness d of the coating 14 using the system 10.

The capacitance meter is communicatively connected to a computer based subsystem 34 adapted to perform computations, execute algorithms and display data and information such as the measured thickness d of the coating 14. In a preferred embodiment, the computer based subsystem 34 includes a processor 38 adapted to execute all functions of the computer based subsystem 34, at least one electronic memory device 42 and a display 46. The electronic memory device can be a computer readable medium adapted to electronically store data, for example, a hard drive, a floppy disk, a zip disk, EEPROM and flash memory.

Placing the first and second conductive plates 22 and 26 in direct contact with the coating 14 forms a capacitive circuit, where the substrate 18 and the coating 14 are dielectrics of the capacitive circuit. Each of the coating 14 and the substrate 18 have a known specific, but different, dielectric constant value. The dielectric constant of the paint and the substrate are known prior to measurement of the coating 14. The capacitance meter 30 is adapted to measure a capacitance value of the coating 14 in combination with the substrate 18 between the first and second conductive plates 22 and 26. That is, system 10 utilizes the capacitance meter 30 to measure the capacitance of a dielectric material between the first and second conductive plates 22 and 26, wherein the dielectric material is the substrate 18 plus the coating 14.

Figure 2:
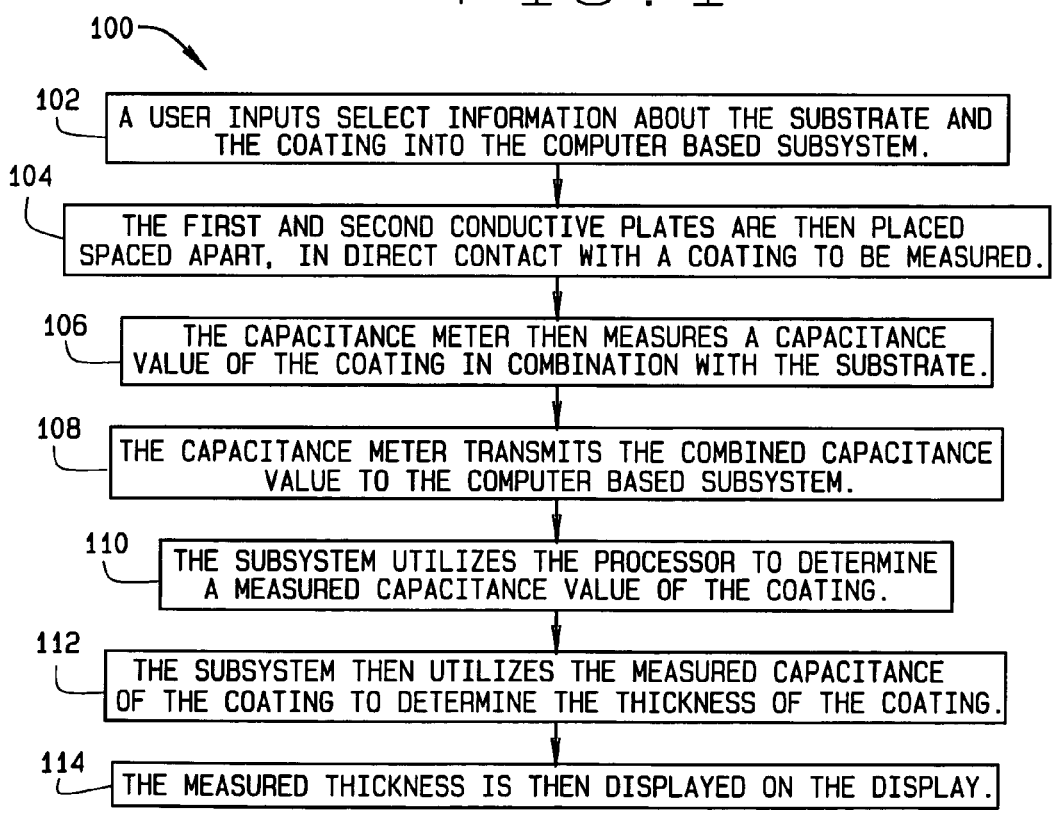
FIG. 2 is a flow chart illustrating the operation of the system, shown in FIG. 1.

FIG. 2 is a flow chart 100 illustrating the operation of the system 10, shown in FIG. 1. Generally, in operation of the system 10, a user inputs select information about the substrate 18 and the coating 14, via a user input device 50, e.g. a keyboard, mouse, or touch screen on the display 46, as indicated at 102. For example, the user inputs one or more of the material composition of the substrate 18, the dielectric constant of the substrate, the type of coating 14 and/or the dielectric constant of the coating 14. The first and second conductive plates 22 and 26 are then placed spaced apart, in direct and uniform contact with a coating 14 to be measured, as indicated at 104. The capacitance meter 30 then measures a capacitance value of the coating 14 in combination with the substrate 18, as indicated at 106. The capacitance meter 30 transmits the combined capacitance value to the computer based subsystem 34, as indicated at 108. The subsystem 34 utilizes the processor 38 to determine a measured capacitance value of the coating 14, as indicated at 110. The subsystem 34 then utilizes the measured capacitance of the coating 14 to determine the thickness d of the coating 14, as indicated at 112. The measured thickness d is then displayed on the display 46, as indicated at 114.

Referring to FIGS. 1 and 2, more specifically, the dielectric constant of the substrate 18 is known and capacitance of the substrate 18 is predetermined prior to measurement of the capacitance of the coating 14 in combination with the substrate 18. The known dielectric value and the predetermined capacitance value of the substrate 18 are stored in the electronic storage device. In a preferred embodiment, the dielectric constants and the capacitance values of a plurality of substrates 18 constructed of different materials, e.g. semi-conductive composites such as carbon fiber epoxy or fiberglass, are organized in at least one look-up table stored in the memory device 42. The look-up table correlates the various material compositions of the substrate 18 with their corresponding capacitance and dielectric values. In a preferred embodiment, a user inputs the material composition of the substrate 18 into the subsystem 34, via the user input device 50. The computer based subsystem 34 receives, from the capacitance meter 30, a measured capacitance value for the coating 14 in combination with the substrate 18. The computer based subsystem 34 executes an algorithm, utilizing processor 38, that uses the material composition input to determine the capacitance value of the substrate 18. For example, the processor 38 accesses the look-up table to determine the capacitance value of the substrate 18 and compute a measured capacitance value of the coating 14. That is, the processor 38 subtracts the known capacitance value of the substrate 18 from the measured capacitance value of the coating 14 plus the substrate 18 to determine the measured capacitance value of the coating 14.

Alternatively, the user could input the dielectric constant of the substrate 18. In this case, the subsystem 34 would utilize the dielectric constant input and the look-up table to determine the capacitance value of the substrate 18 and compute a measured capacitance value of the coating 14. In another alternate preferred embodiment, a user inputs the predetermined capacitance value of the substrate 18 into the subsystem 34. The subsystem 34 then executes an algorithm, via the processor 38, that utilizes the capacitance value input to determine the measured capacitance value of the coating 14.

The measured capacitance of the coating 14 is directly related to the thickness d of the coating 14. In a preferred embodiment, the dielectric constants for a plurality of coatings are stored in the memory device 42. Preferably, the coating dielectric constants are organized in at least one look-up table stored in the memory device 42. To determine the thickness d of the coating 14, the subsystem 34 utilizes the processor 38 to execute the following equation:

$$C=(\in A)/(2d),$$

where C is the measured capacitance value of the coating 14, $\in$ is the dielectric constant of the coating 14, A is the sum area of the first and second conducting plates and d is the thickness of the coating 14.

In an alternate preferred embodiment, at least one look-up table also includes thickness values of the coating 14 that relate to various measured capacitances of the coating 14. Therefore, when the subsystem 34 determines the measured capacitance value of coating 14, as described above, the subsystem 34 utilizes corresponding thickness value in the look-up table to determine the thickness d of the coating 14.

Figure 3:
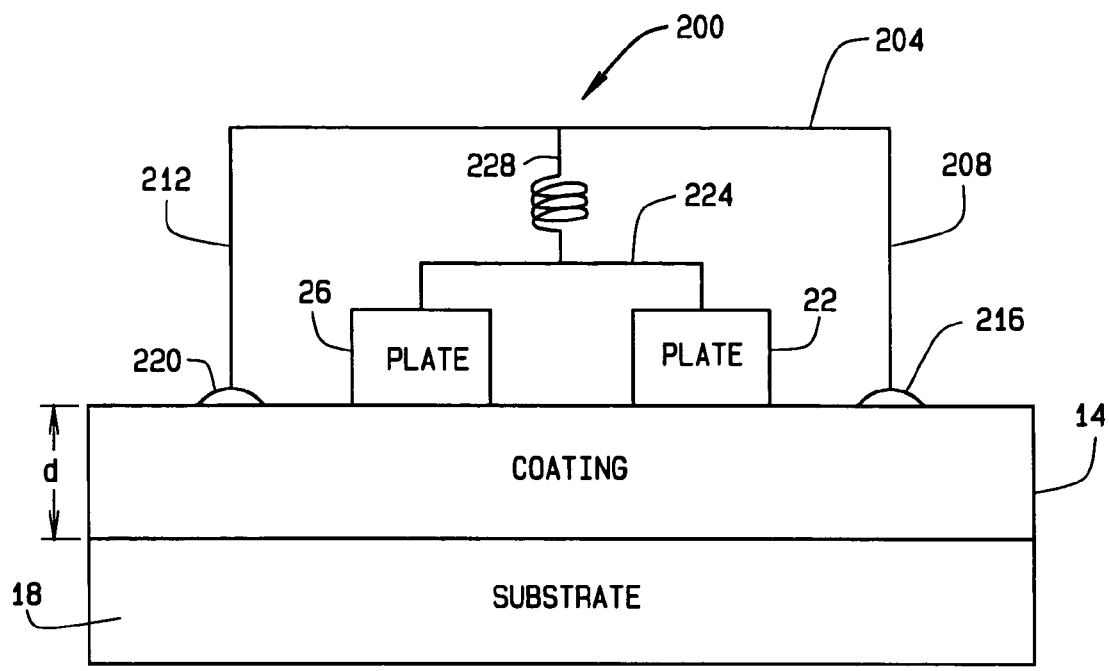
FIG. 3 is block diagram illustrating a stabilizing device used to hold a first and second conducting plate securely and uniformly in place while a thickness of a coating is measured using the system shown in FIG. 1.

Referring now to FIG. 3, to obtain accurate capacitance reading, and therefore, to accurately determine the thickness d, the first and second conducting plates 22 and 26 must be firmly and uniformly in contact with the coating 14. In a preferred embodiment, the first and second conducting plates 22 and 26 are held firmly and securely in direct contact with the coating 14 using a stabilizing device 200. The stabilizing device 200 includes a bridge 204 having a first leg 208 and a second leg 212. The bridge 204 is a rigid structure having a first affixing device 216 attached at the end of the first leg 208 and a second affixing device 220 attached at an end of the second leg 212. The affixing devices 216 and 220 can be any device suitable for temporarily but stably affixing the bridge 204 to a surface of the coating 14. The stabilizing device 200 additionally includes a coupling bracket 224 coupled to the first and second conducting plates 22 and 26. The coupling bracket 224 is a rigid structure that maintains the first and second conducting plates 22 and 26 a fixed distance apart. A force device 228, such as a spring, piston, pressurized plate or any other suitable device, is disposed between the bridge 204 and the coupling bracket 224.

The stabilizing device 200 maintains the first and second conducting plates 22 and 26 firmly and securely in place by temporarily but stably affixing the bridge 204 to the coating 14, via the first and second affixing devices 216 and 220. With the bridge 204 held firmly in place the pressure device 228 applies pressure to the coupling bracket 224 such that the first and second conduction plates 22 and 26 are held firmly against the coating 14. The pressure applied by the pressure device 228 is sufficient to maintain the first and second conducting plates 22 and 26 firmly and securely in direct contact with the coating 14 without dislodging or disconnecting the affixing devices 216 and 220 from the surface of the coating 14.

Figure 4:
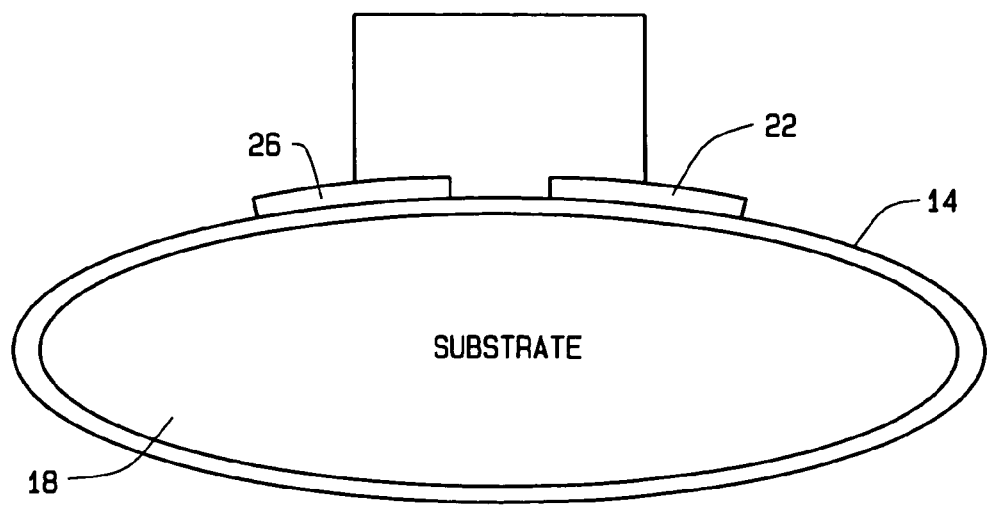
FIG. 4 is a block diagram illustrating another preferred embodiment of the system shown in FIG. 1, in which the system is adapted to measure the thickness of a coating on a contoured substrate.

Referring now to FIG. 4, in another alternate preferred embodiment, the system 10 is adapted to measure the thickness of the coating 14 on a contoured substrate 18. In this embodiment the first and second conducting plates 22 and 26 are constructed of a flexible or conformal material such as copper, conductive plastic or aluminum. Thus, if it is desired to measure the thickness of a coating on a curved surface, the first and second conducting plates 22 and 26 can be conformed to the contour of the substrate 18, thereby making direct, uniform and constant contact with the substrate 18. Therefore, the first and second conducing plates 22 and 26 make good electrical contact with the coating 14. The direct, uniform and constant contact substantially ensures that the only variable that affects the difference between the measured capacitance of the coating 14 in combination with the substrate 18 and the known capacitance of the substrate 18 is the thickness of the coating. Thus, the system 10 is able to accurately measure the thickness d of the coating 14.

It is envisioned that system 10 is light weight and portable. Therefore, the system 10 can be easily transported and utilized to measure the thicknesses of various coatings 14 on various substrates 18, or to measure the thickness of a single coating 14 at various different location on a single substrate 18.

While the invention has been described in terms of various specific embodiments, those skilled in the art will recognize that the invention can be practiced with modification within the spirit and scope of the claims.

Description of the Reference Numerals
10 common pressure cylinder
14 printing unit
18 blanket cylinder
20 cylinder axis
26 eccentric bearing means
28 primary axis
30 bracket
36 wheel
38 fine adjusting means
40 drive means

What is claimed is:

1. A system for measuring a thickness of a non-conductive coating on a semi-conductive substrate, said system comprising:
   a first conducting plate adapted to be placed in contact with a non-conductive coating on a semi-conductive substrate at a first location;
   a second conducting plate adapted to be placed in contact with the non-conductive coating at a second location; and
   a capacitance meter electrically connected to the first and second conducting plates, the capacitance meter adapted to measure a capacitance value of the non-conductive coating in combination with the semi-conductive substrate between the first and second conducting plates, to thereby determine a measured thickness of the non-conductive coating on the semi-conductor substrate.

2. The system of claim 1, wherein the system further comprises a computer based subsystem electrically connected to the capacitance meter, the computer based subsystem adapted to use the measured capacitance value of the coating in combination with the substrate to determine a measured capacitance value of the coating between the first and second conducting plates.

3. The system of claim 2, wherein the computer based subsystem is further adapted to utilize at least one lookup table to determine the measured capacitance value of the coating.

4. The system of claim 2, wherein the computer based subsystem is further adapted to determine a measured thickness of the coating based on the measured capacitance value of the coating.

5. The system of claim 4, wherein the computer based subsystem is further adapted to utilize at least one lookup table to determine the measured thickness of the coating.

6. The system of claim 4, wherein the computer based subsystem is further adapted to determine the measured thickness of the coating utilizing the following equation:

$$C=(\in A)/(2d),$$

wherein C is the measured capacitance value of the coating, $\in$ is the dielectric constant of the coating, A is the sum area of the first and second conducting plates and d is the measured thickness of the coating.

7. The system of claim 2, wherein the computer based subsystem is further adapted to display the measured thickness of the coating.

8. The system of claim 1, wherein the system further comprises a stabilizing device adapted to hold the first and second conducting plates in direct and uniform contact with the non-conductive coating.

9. The system of claim 8, wherein the stabilizing device comprises a bridge structure having a first leg with a first affixing device attached thereto and second leg with a second affixing device attached thereto, the first and second affixing devices adapted to temporarily affix the bridge to a surface of the non-conductive coating.

10. The system of claim 9, wherein the stabilizing device further comprises a force device disposed between the bridge structure and the first and second conducting plates, the force device adapted to apply a force to the first and second conducting plates that holds the first and second conducting plates in direct and uniform contact with the non-conductive coating.

11. The system of claim 1, wherein at least one of the first and second conducting plates are constructed of a conformal material adapted to be conformed a contoured substrate.

12. A method for measuring a thickness of a coating on a component of a mobile platform, said method comprising:
  placing a first conducting plate in contact with a non-conductive coating on a surface of a semi-conductive component of a mobile platform at a first location, thereby creating a first portion of a capacitor having the non-conductive coating as a dielectric;
  placing a second conducting plate in contact with the non-conductive coating on the surface of the semi-conductive component of the mobile platform at a second location, thereby creating a second portion of a capacitor having the non-conductive coating as a dielectric;
  measuring a capacitance value of the non-conductive coating in combination with the semi-conductive mobile platform component utilizing a capacitance meter electrically connected to the first and second conducting plates, wherein the non-conductive coating has a first dielectric constant and the semi-conductive mobile platform component has a second dielectric constant; and
  determining a measured thickness of the non-conductive coating based on the measured capacitance value of the non-conductive coating in combination with the semi-conductive component.

13. The method of claim 12, wherein determining the measured thickness of the coating comprises determining a measured capacitance value of the coating based on the measured capacitance value of the coating in combination with the mobile platform component, utilizing a computer based subsystem electrically connected to the capacitance meter.

14. The method of claim 13, wherein determining the measured capacitance value of the coating comprises utilizing at least one lookup table included in the computer based subsystem to determine a differential value between a predetermined capacitance value of the mobile platform component without the coating and the measured capacitance value of the coating in combination with the mobile platform component.

15. The method of claim 13, wherein determining the measured thickness of the coating further comprises utilizing the determined measured capacitance value of the coating to determine the measured thickness of the coating.

16. The method of claim 15, wherein utilizing the measured capacitance value of the coating to determine the measured thickness of the coating comprises utilizing at least one lookup table included in the computer based subsystem to determine the measured thickness of the coating.

17. The method of claim 15, wherein utilizing the measured capacitance value of the coating to determine the measured thickness of the coating comprises solving for d in the following equation:

$$C = (\in A)/(2d),$$

wherein C is the determined capacitance value of the coating, $\in$ is a dielectric constant of the coating, A is a sum area of the first and second conducting plates and d is the measured thickness of the coating.

18. The method of claim 12, wherein placing the first and second conducting plates in contact with the non-conductive coating comprises:
  temporarily affixing a stabilizing device to the coating; and
  utilizing the stabilizing device to hold the first and second conducting plates in direct and uniform contact with the non-conductive coating.

19. The method of claim 12, wherein placing the first and second conducting plates in contact with the non-conductive coating comprises conforming at least one of the first and second conducting plates to a contoured substrate.

20. A system for measuring a thickness of a coating on a surface of a mobile platform component, said system comprising:
  a first conducting plate adapted to be placed in contact with a non-conductive coating on a surface of semi-conductive mobile platform component at a first location, thereby creating a first portion of a capacitor having the non-conductive coating as a dielectric;
  a second conducting plate adapted to be placed in contact with the non-conductive coating on the surface of semi-conductive mobile platform component at a second location, thereby creating a second portion of the capacitor having the non-conductive coating as a dielectric;
  a capacitance meter electrically connected to the first and second conducting plates, the capacitance meter adapted to measure a capacitance value of the non-conductive coating in combination with the semi-conductive mobile platform component between the first and second conducting plates, wherein the non-conductive coating has a first dielectric constant and the semi-conductive mobile platform component has a second dielectric constant; and
  a computer based subsystem electrically connected to the capacitance meter, the computer based subsystem adapted to use the measured capacitance value of the non-conductive coating in combination with the semi-conductive mobile platform component to determine a measured thickness of the non-conductive coating.

21. The system of claim 20, wherein the computer based subsystem is further adapted to use the measured capacitance value of the non-conductive coating in combination with the semi-conductive mobile platform component to determine a measured capacitance value of the coating.

22. The system of claim 21, wherein the computer based subsystem is further adapted to utilize at least one lookup table to determine the measured capacitance value of the coating based on the capacitance value of the non-conductive coating in combination with the semi-conductive mobile platform component.

23. The system of claim 21, wherein the computer based subsystem is further adapted to use the measured capacitance value of the coating to determine the measured thickness of the coating.

24. The system of claim 23, wherein the computer based subsystem is further adapted to utilize at least one lookup table to determine the measured thickness of the coating based on the measured capacitance value of the coating.

25. The system of claim 23, wherein the computer based subsystem is further adapted to determine the measured thickness of the coating utilizing the following equation:

$$C = (\in A)/(2d),$$

wherein C is the measured capacitance value of the coating, $\in$ is the dielectric constant of the coating, A is the sum area of the first and second conducting plates and d is the measured thickness of the coating.

26. The system of claim 20, wherein the system further comprises a stabilizing device adapted to hold the first and second conducting plates in direct and uniform contact with the non-conductive coating.

27. The system of claim 26, wherein the stabilizing device comprises a bridge structure having a first leg with a first affixing device attached thereto and second leg with a second affixing device attached thereto, the first and second affixing devices adapted to temporarily affix the bridge to a surface of the non-conductive coating.

28. The system of claim 27, wherein the stabilizing device further comprises a force device disposed between the bridge structure and the first and second conducting plates, the force device adapted to apply a force to the first and second conducting plates that holds the first and second conducting plates in direct and uniform contact with the non-conductive coating.

29. The system of claim 20, wherein at least one of the first and second conducting plates are constructed of a conformal material adapted to be conformed a contoured substrate.

* * * * *